US006403435B1

(12) United States Patent
Kang et al.

(10) Patent No.: US 6,403,435 B1
(45) Date of Patent: Jun. 11, 2002

(54) METHOD FOR FABRICATING A SEMICONDUCTOR DEVICE HAVING RECESSED SOI STRUCTURE

(75) Inventors: Chang Yong Kang, Kyonggi-do; Myoung Kyu Park, Chungcheongbuk-do, both of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/722,518

(22) Filed: Nov. 28, 2000

(30) Foreign Application Priority Data

Jul. 21, 2000 (KR) .......................... P00-41986

(51) Int. Cl.7 .................. H01L 21/331; H01L 21/8222
(52) U.S. Cl. ................. 438/311; 438/479; 438/517
(58) Field of Search ................. 257/282, 283, 257/347, 349; 438/149, 225, 297, 310, 311, 318, 353, 362, 455, 459, 517

(56) References Cited

U.S. PATENT DOCUMENTS 6,091,112 A    7/2000  Kwon .................. 257/347
6,190,952 B1 * 2/2001  Xiang et al. ............. 438/155
6,235,567 B1 * 5/2001  Huang .................. 438/202
6,238,967 B1 * 5/2001  Shiho et al. .............. 438/244
6,300,172 B1 * 10/2001 Ang et al. ............... 438/149

FOREIGN PATENT DOCUMENTS

JP         02000091534 A  *  3/2000

* cited by examiner

Primary Examiner—Olik Chaudhuri
Assistant Examiner—Hoai Pham
(74) Attorney, Agent, or Firm—Morgan, Lewis & Bockius LLP

(57) ABSTRACT

A semiconductor device having a recessed silicon on insulator (SOI) structure includes an SOI substrate having a cell region, a peripheral region and a field region, the SOI substrate having a first semiconductor layer, an insulating layer on the first semiconductor layer, and a second semiconductor layer on the insulating layer, a trench in the field region of the second semiconductor layer, a device isolation film within the trench, a peripheral region recessed in the second semiconductor layer, and an active semiconductor device on the cell region and the peripheral region of the second semiconductor layer.

6 Claims, 3 Drawing Sheets

METHOD FOR FABRICATING A SEMICONDUCTOR DEVICE HAVING RECESSED SOI STRUCTURE

BACKGROUND OF THE INVENTION

1. Field of the Invention

The present invention relates to a semiconductor device, and more particularly, to a dynamic random access memory (DRAM) device based on a silicon on insulator (SOI) structure, and to a method for fabricating the same.

2. Background of the Related Art

Recently, processes for fabricating an integrated circuit device known as an SOI device have been developed. The SOI device is a semiconductor device fabricated within a thin silicon layer that covers an electrical insulating region formed on a substrate. The insulating region includes an $SiO_2$ layer deposited on a semiconductor substrate, such as silicon or gallium arsenide. A circuit that is electrically insulated from a lower substrate can then be formed using the SOI device.

The SOI device provides various advantages as compared with a conventional semiconductor device. For example, the SOI device generally consumes less power. Also, the SOI device has smaller parasitic capacitance, and thus operates at higher speeds. Furthermore, since the SOI device is less susceptible to adverse effects of ionization emission, it is more reliable in applications where ionization emission may cause operational error.

Recently, a structure where devices are arranged on both sides of a SOI substrate to reduce an area of a unit cell has been disclosed. The SOI technology is used to mutually isolate active devices by forming the active devices within individual silicon islands supported on an upper portion of an insulating substrate. Accordingly, the SOI structure has excellent high packing density and reduces the number of process steps as compared with a bulk silicon structure. As described above, the active device formed on the upper portion of the SOI substrate is called an SOI device. Since the SOI device has a dramatically reduced parasitic capacitance as compared with a bulk silicon device, high operational speed of a circuit and low power consumption can be obtained.

Unwanted charges are accumulated in a bulk (region) while a unit cell is floating and operating, so that the concentration of impurities in the bulk is reduced. In this case, a so-called "floating body" phenomenon, which varies a threshold value of a transistor, occurs. For this reason, a problem arises in that the unit cells do not operate uniformly.

A DRAM includes a memory cell array having a plurality of memory cells regularly arranged in X and Y directions, and a peripheral circuit formed around the memory cell array, for controlling the cells.

With an increase of packing density of a DRAM device, reduction of a unit cell area is required. It is becoming difficult to reduce a design rule of a unit cell due to limitation of photolithography process and degradation of electrical characteristic of a device. In this respect, many attempts to reduce an area of the unit cell in the same design rule by varying layout and sensing method of the cell have been made recently. Recently, to reduce the area of the unit cell, the SOI substrate has been used so that the devices are arranged at both sides of the SOI substrate.

A related art semiconductor device based on a SOI structure and method for fabricating the same will now be described with reference to the accompanying drawings.

As shown in FIGS. 1A and 1B, a DRAM device is formed on a SOI substrate 100 in which device isolation films 14 are formed. The SOI substrate, as shown in FIG. 1B, has a three-layered structure in which an $SiO_2$ layer 12 is interposed between Si single crystallization structures. A lower silicon layer 11 acts as a mechanical support, and the $SiO_2$ layer 12, which is an electrical insulating layer, and an ultra-thin single crystallization silicon layer 13 are formed thereon. A subminiature integrated circuit will be laid on the single crystallization silicon layer 13.

In case where a transistor is formed in a cell region and a peripheral region based on the SOI substrate, the applied voltage is small due to reduction of well and load resistance. For this reason, the transistor can operate at low power. Also, the transistor has high operational speed. However, when a bias is applied to the substrate to control a threshold voltage of the transistor of the cell region, a threshold voltage of the peripheral region also needs to be high. For this reason, it is difficult for the peripheral region circuits to realize low power consumption and high reproducibility. As high packing density is required in the DRAM device, a device can be formed within a semiconductor substrate formed over a handle wafer with an insulating material interposed between the sermiconductor substrate and the handle wafer. Thus, limitation on packing density in the process can be overcome. For this reason, much attention has been centered on fabrication of a DRAM device having an SOI structure. Further, as described above, in SOI transistors, the applied voltage is small due to reduction of well and load resistance. For this reason, the transistor can operate at low power and at high speed.

However, the DRAM device having a SOI structure has several problems. One of the problems is the "floating body" effect. Since the active region of the transistor is electrically floating, the characteristics of the transistor are unstable, thereby causing malfunctions of the transistor and degradation of characteristics of the transistor.

Furthermore, in the SOI DRAM, to control the threshold voltage of the cell region, it is necessary to apply a substrate voltage. However, in the related semiconductor device based on an SOI structure, a substrate voltage is applied to the peripheral region as well as the cell region, thereby degrading the low pow-r characteristic and high reproducibility of the SOI device.

SUMMARY OF THE INVENTION

Accordingly, the present invention is directed to a semiconductor device having recessed SOI structure and a method for fabricating same that substantially obviates one or more of the problems due to limitations and disadvantages of the related art.

The inventions solves at least the above problems and/or disadvantages and provides at least the advantages described hereinafter.

An aspect of the present invention is to provide a semiconductor device having a recessed SOI structure and method for fabricating the same in which a substrate voltage is applied to a cell region to easily control a threshold voltage, and where a peripheral region is recessed to realize low power and high reproducibility.

Additional features and advantages of the invention will be set forth in the description which follows, and in part will be apparent from the description, or may be learned by practice of the invention. The advantages of the invention will be realized and attained by the structure particularly pointed out in the written description or its equivalents and claims hereof as well as the appended drawings.

To achieve at least these advantages in a whole or in part and in accordance with purposes of the present invention, as embodied and broadly described, a semiconductor device having a recessed silicon on insulator (SOI) structure includes an SOI substrate having a cell region, a peripheral region and a field region, the SOI substrate having a first semiconductor layer, an insulating layer on the first semiconductor layer, and a second semiconductor layer on the insulating layer, a trench in the field region of the second semiconductor layer, a device isolation film within the trench, a peripheral region recessed in the second semiconductor layer, and an active semiconductor device on the cell region and the peripheral region of the second semiconductor layer.

In another aspect, a method for fabricating a semiconductor device based on a SOI structure having an SOI substrate including a first semiconductor layer, an insulating layer on the first semiconductor layer, and a second semiconductor layer on the insulating layer, the semiconductor device having a cell region, a peripheral region and a field region, the method includes the steps of forming a field insulating film within the second semiconductor layer of the peripheral region and on a surface of the second semiconductor layer, forming a trench in the field region of the second semiconductor layer, forming a device isolation film within the trench, and removing the field insulating film to form a recessed peripheral region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Figure 1A:
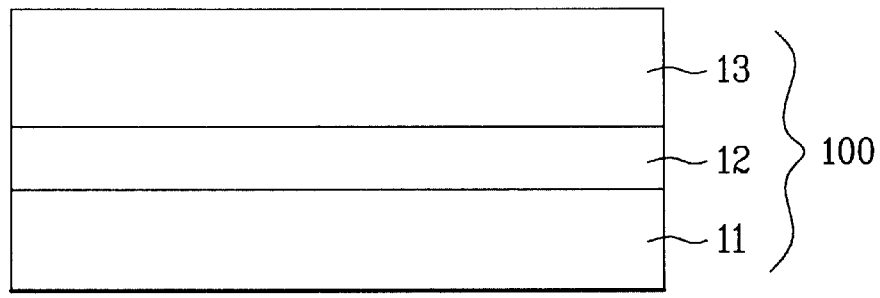
FIG. 1A is a sectional view showing an SOI substrate.
Figure 1B:
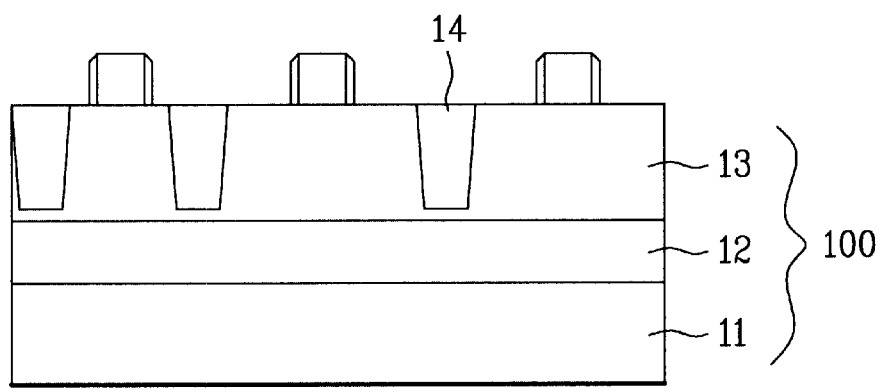
FIG. 1B is a sectional view showing a structure of a related art semiconductor device based on the SOI substrate.

Reference will now be made in detail to the preferred embodiments of the present invention, examples of which are illustrated in the accompanying drawings.

FIGS. 2A to 2G are sectional views showing fabrication process steps of a semiconductor device based on a recessed SOI structure according to the present invention.

First, a structure of a semiconductor device based on a SOI structure will be described with reference to FIG. 2G. As shown in FIG. 2G, a SOI substrate 200, in which a field region, a cell region and a peripheral region are defined, is provided and has a three-layered structure of bulk silicon layer 21, an $SiO_2$ layer 22, and a single crystallization silicon layer 23. A trench is formed in the field region of the single crystallization silicon layer 23, and device isolation films 27a are formed within the trench. The peripheral region is recessed, and a DRAM device 29 is formed on the cell region and the recessed peripheral region.

At this time, the single crystallization silicon layer 23 has a thickness of 700~1500Å for a partially depleted (PD) SOI device, and 700Å for a fully depleted (FD) SOI device.

A method for fabricating the aforementioned semiconductor device having an SOI structure will now be described.

Figure 2A:
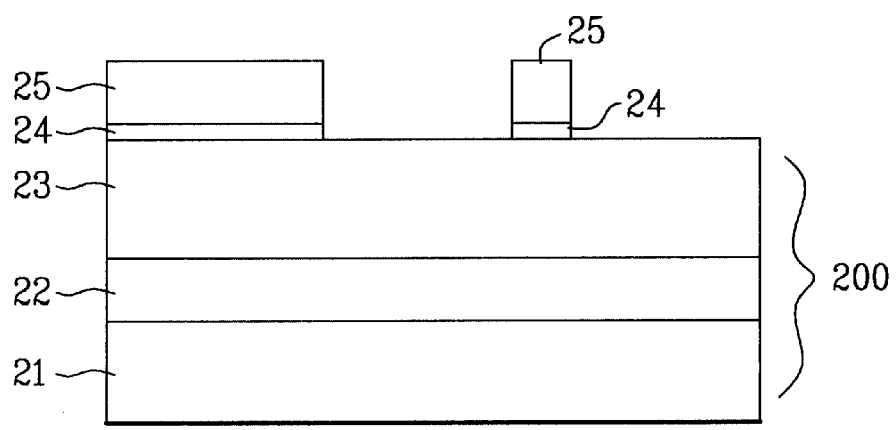
FIGS. 2A to 2G are sectional views showing fabricating process steps of a semiconductor device based on a recessed SOI structure according to the present invention.

As shown in FIG. 2A, a first insulating film 24 and a second insulating film 25 are sequentially deposited on the SOI substrate 200, where the cell region and the peripheral region are defined. The first insulating film 24 and the second insulating film 25 are then selectively removed to partially expose the single crystallization silicon layer 23.

The first insulating film 24 is formed of an oxide film and the second insulating film 25 is formed of a nitride film.

The SOI substrate 200 is a wafer having a three-layered structure in which an $SiO_2$ layer 22 is interposed between single crystallization silicon layers 21 and 23. The lower bulk silicon layer 21 acts as a mechanical support, and the $SiO_2$ layer 22, which is an electrical insulating layer, and the single crystallization silicon layer 23 of ultra-thin film are formed thereon. A subminiature integrated circuit will be laid on the single crystallization silicon layer 23.

Three methods are commonly used for forming the SOI structure. There is a zone-melting recrystallization (ZMR) method, a separation by implantation of oxygen (SIMOX) method, and wafer direct bonding (B) method. In the SIMOX method, an $SiO_2$ layer is formed within a silicon material at a constant depth by implanting oxygen into a silicon wafer, and then performing annealing at a high temperature. In the WDB method, a junction surface between a wafer on which an oxide film is deposited and a bare wafer is formed to be thin, and the bare wafer is bonded to the wafer on which tile oxide film is deposited, by annealing process of high temperature.

Figure 2B:
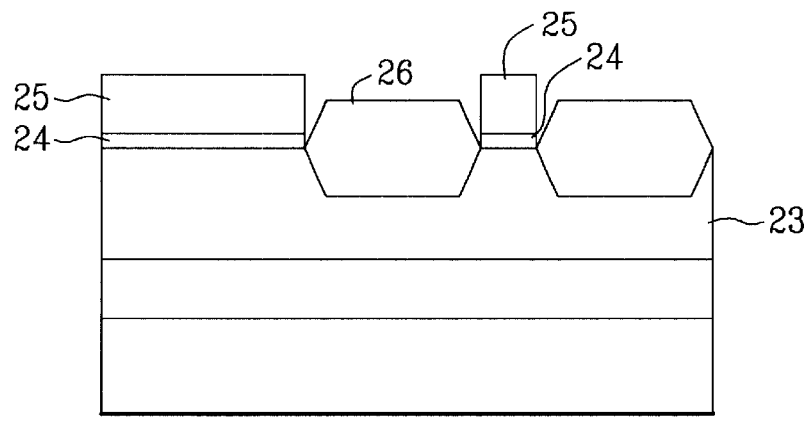
Figure 2C:
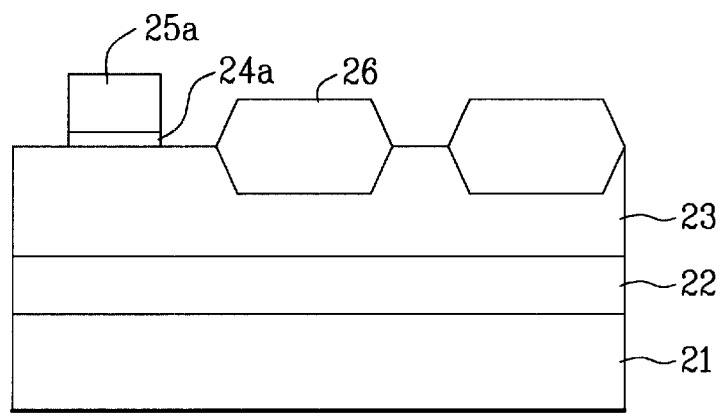

As shown in FIG. 2B, a field oxide film 26 is formed on the peripheral region, i.e., on the exposed single crystallization silicon layer 23, by an annealing oxidation process using the patterned first and second insulating films 24 and 25 as masks. Subsequently, as shown in FIG. 2C, the first and second insulating films 24 and 25 are selectively removed, and then a first insulating film pattern 24a and a second insulating film pattern 25a are formed in the cell region.

Figure 2D:
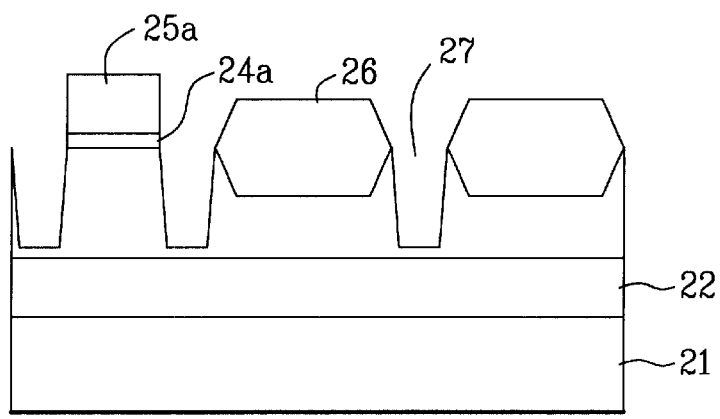

As shown in FIG. 2D, the upper single crystallization silicon layer 23 of the SOI substrate 200 is partially removed using the first and second insulating film patterns 24a and 25a and the field oxide film 26 as masks to form a trench 27.

Figure 2E:
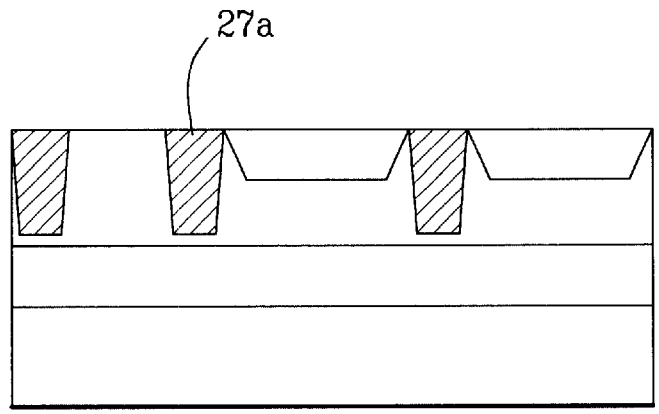
Figure 2F:
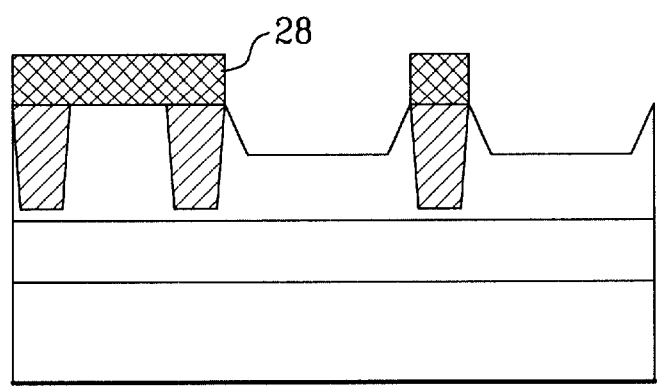
Figure 2G:
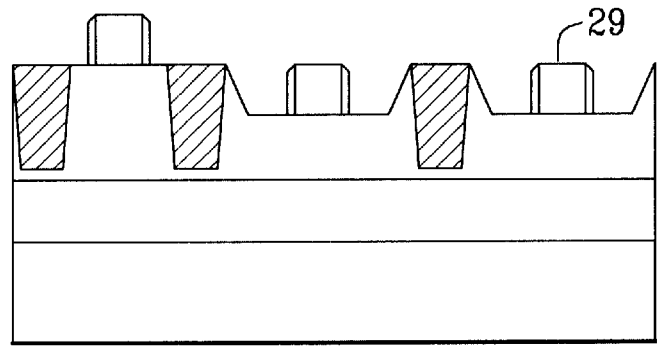

Subsequently, as shown in FIG. 2E, a third insulating film is formed on the entire surface, including the trench 27, and then planarized to form the device isolation films 27a. As shown in FIG. 2F, the photoresist is patterned by photolithography to remain on the cell region and the device isolation films. Tile remaining field oxide film 26 is removed using the patterned photoresist 28 as a mask. Thus, the SOI substrate having a recessed structure is formed in the peripheral region.

As shown in FIG. 2G, the photoresist 28 is removed, and a process for forming the DRAM device 29 is performed on the SOI substrate of the cell region and the recessed peripheral region, so that the cell region has bulk characteristics while the recessed single crystallization silicon layer 23 of the peripheral region has a controlled thickness. Thus, a PD SOI device or an FD SOI device can be obtained.

At this time, the single crystallization silicon layer 23 is partially recessed, and the FD SOI device and the PD SOI device can be formed according to a thickness of the single crystallization silicon layer 23 that remains in regions where it is not recessed. Where the remaining single crystallization silicon layer 23 has a thickness of 700~1500 Å, the PD SOI device is formed. Where the remaining single crystallization silicon layer 23 has a thickness of 700 Å, the FD SOI device is formed.

Accordingly, to realize both the unique characteristics of the SOI device in the peripheral region and bulk characteristics in the cell region, the peripheral region is recessed.

Thus, the threshold voltage can be controlled according to bulk Si characteristic in the cell region. The silicon epitaxial layer is partially recessed in the peripheral region. The FD SOI device and the PD SOI device can be formed according to the thickness of the remaining silicon epitaxial layer without being recessed. This reduces junction cap, thereby enabling high speed operation. Also, low operating voltage can be used.

Furthermore, the cell region is connected with the body in the peripheral region, and body contact is possible, thereby removing the "floating body" effect.

The semiconductor device having the recessed SOI structure has the following advantages.

First, since the peripheral region is recessed in the DRAM based on the SOI structure, the cell region has bulk characteristics and the peripheral region has unique characteristics of the SOI structure. This dramatically reduces parasitic capacitance, thereby resulting in high operationed speed and low power consumption.

Furthermore, since the cell region is connected to the peripheral region, body contact is possible, thereby eliminating the floating body effect. As a result, a substrate voltage can be applied to the peripheral region without changing the layout, thereby improving operation stability of the device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device based on a SOI structure having an SOI substrate including a first semiconductor layer, an insulating layer on the first semiconductor layer, and a second semiconductor layer on the insulating layer, the semiconductor device having a cell region, a peripheral region and a field region, the method comprising the steps of:

forming a field insulating film within the second semiconductor layer of the peripheral region and on a surface of the second semiconductor layer;

forming a trench in the field region of the second semiconductor layer;

forming a device isolation film within the trench; and removing the field insulating film to form a recessed peripheral region.

2. The method of claim 1, wherein the step of forming the field insulating film includes the steps of:

sequentially forming a first insulating film and a second insulating film on the SOI substrate, excluding the peripheral region; and oxidizing the second semiconductor layer of the peripheral region using the first and second insulating films as masks.

3. The method of claim 1, wherein the step of forming the trench includes the steps of:

patterning and removing the first and second insulating films on the field region; and selectively removing the second semiconductor layer using the patterned first and second insulating films and the field insulating film as masks.

4. The method of claim 1, wherein the step of forming the device isolation films includes the steps of:

forming an insulating film on the entire surface including the trench; and planarizing the insulating film by chemical mechanical polishing (CMP).

5. The method of claim 1, wherein the second semiconductor layer that remains without being recessed in the peripheral region has a thickness of approximately 700 to 1500 Å.

6. The method of claim 1, wherein the second semiconductor layer that remains without being recessed in the peripheral region has a thickness of approximately 700 Å.

* * * * *